United States Patent
Dong et al.

(10) Patent No.: US 11,216,096 B2
(45) Date of Patent: Jan. 4, 2022

(54) TOUCH DISPLAY PANEL, METHOD OF MANUFACTURING THE SAME, METHOD OF DRIVING THE SAME, AND TOUCH DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Xiangdan Dong, Beijing (CN); Yunsheng Xiao, Beijng (CN); Tingliang Liu, Beijing (CN); Hongwei Ma, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

(*) Notice: Subject to any disclaimer, the term of this patent is extended or adjusted under 35 U.S.C. 154(b) by 26 days.

(21) Appl. No.: 16/621,832

(22) PCT Filed: Mar. 27, 2019

(86) PCT No.: PCT/CN2019/079825
§ 371 (c)(1),
(2) Date: Dec. 12, 2019

(87) PCT Pub. No.: WO2019/223419
PCT Pub. Date: Nov. 28, 2019

(65) Prior Publication Data
US 2021/0141476 A1   May 13, 2021

(30) Foreign Application Priority Data
May 25, 2018 (CN) .......................... 201810515682.8

(51) Int. Cl.
*G06F 3/041* (2006.01)
*G06F 3/044* (2006.01)
(Continued)

(52) U.S. Cl.
CPC .......... *G06F 3/0412* (2013.01); *G06F 3/0446* (2019.05); *H01L 27/323* (2013.01);
(Continued)

(58) Field of Classification Search
CPC ... G06F 3/0412; G06F 3/0446; H01L 27/323; H01L 51/5253; H01L 27/3258;
(Continued)

(56) References Cited

U.S. PATENT DOCUMENTS 10,296,114 B2 * 5/2019 Lee ......................... G06F 3/042
10,388,671 B2 * 8/2019 Zhang ................. H01L 51/5012
(Continued)

FOREIGN PATENT DOCUMENTS

CN    105493013 A    4/2016
CN    106024836 A    10/2016
(Continued)

OTHER PUBLICATIONS

International Search Report and Written Opinion issued in corresponding International Application No. PCT/CN2019/079825, dated Jun. 25, 2019, with English language translation.
(Continued)

*Primary Examiner* — Vinh T Lam
(74) *Attorney, Agent, or Firm* — McDermott Will and Emery LLP

(57) ABSTRACT

A touch display panel includes: an array substrate; a pixel defining layer disposed on a side of the array substrate; a plurality of light-emitting layers correspondingly disposed in a plurality of sub-pixel regions defined by the pixel defining layer; a plurality of electrode dividing strips dis-
(Continued)

posed on a side of the pixel defining layer away from the array substrate, the plurality of electrode dividing strips dividing a touch area of the touch display panel into a plurality of strip-shaped areas; and a divided electrode layer disposed on a side of the plurality of electrode dividing strips away from the array substrate and disposed in the plurality of strip-shaped areas. The divided electrode layer includes a plurality of first electrode strips correspondingly located in the strip-shaped areas and a plurality of second electrode strips correspondingly located on surfaces of the electrode dividing strips away from the array substrate.

15 Claims, 7 Drawing Sheets

(51) Int. Cl.
*H01L 27/32* (2006.01)
*H01L 51/52* (2006.01)
*H01L 51/56* (2006.01)

(52) U.S. Cl.
CPC ...... *H01L 27/3246* (2013.01); *H01L 27/3258* (2013.01); *H01L 27/3276* (2013.01); *H01L 51/5209* (2013.01); *H01L 51/5225* (2013.01); *H01L 51/5253* (2013.01); *H01L 51/56* (2013.01); *H01L 2251/558* (2013.01)

(58) Field of Classification Search
CPC . H01L 51/56; H01L 27/3276; H01L 51/5225; H01L 27/3246; H01L 51/5209; H01L 2251/558
See application file for complete search history.

(56) References Cited

U.S. PATENT DOCUMENTS

| | | |
|---|---|---|
| 2004/0108811 A1 | 6/2004 | Klausmann et al. |
| 2016/0018935 A1* | 1/2016 | Wei .................. H01L 27/1259 345/173 |
| 2017/0033323 A1* | 2/2017 | Chida ................ H01L 51/0097 |
| 2017/0269745 A1 | 9/2017 | Ding et al. |
| 2018/0122883 A1* | 5/2018 | Beak .................. H01L 51/0096 |
| 2018/0197885 A1* | 7/2018 | Lee ........................ H01L 23/544 |
| 2018/0203567 A1* | 7/2018 | Kim .................... G06F 3/04166 |
| 2018/0329549 A1* | 11/2018 | Miyamoto ............ G06F 3/0445 |
| 2018/0342563 A1 | 11/2018 | You et al. |
| 2019/0035859 A1* | 1/2019 | Kang .................... G06F 3/0448 |
| 2019/0204975 A1* | 7/2019 | Xie ........................ G06F 3/0443 |
| 2020/0004363 A1 | 1/2020 | Yang et al. |
| 2020/0110337 A1* | 4/2020 | Tanigaki ................ H05B 33/22 |
| 2020/0387279 A1* | 12/2020 | Kim ...................... G06F 3/0412 |

FOREIGN PATENT DOCUMENTS

| | | |
|---|---|---|
| CN | 106354302 A | 1/2017 |
| CN | 106527815 A | 3/2017 |
| CN | 107104130 A | 8/2017 |
| CN | 107168578 A | 9/2017 |
| CN | 108762561 A | 11/2018 |

OTHER PUBLICATIONS

First Office Action issued in corresponding Chinese Application No. 201810515682.8, dated Nov. 29, 2019, with English language translation.

* cited by examiner

TOUCH DISPLAY PANEL, METHOD OF MANUFACTURING THE SAME, METHOD OF DRIVING THE SAME, AND TOUCH DISPLAY DEVICE

CROSS-REFERENCE TO RELATED APPLICATION

The present application is a national phase entry under 35 USC 371 of International Patent Application No. PCT/CN2019/079825 filed on Mar. 27, 2019, which claims priority to Chinese Patent Application No, 201810515682.8, filed with the Chinese Patent Office on May 25, 2018, titled "TOUCH DISPLAY PANEL, METHOD OF MANUFACTURING THE SAME, METHOD OF DRIVING THE SAME, AND TOUCH DISPLAY DEVICE", which are incorporated herein by reference in their entirety.

TECHNICAL FIELD

The present disclosure relates to the field of display technologies, and in particular, to a touch display panel, a method of manufacturing the same, a method of driving the same, and a touch display device.

BACKGROUND

Organic light-emitting diode (OLED) display devices have attracted more and more attention and are increasingly favored by the display industry due to their advantages of self-luminescence, high contrast, high color gamut, wide viewing angle, light and thin structure, and compatibility with flexible substrates, and are referred to as one of the next-generation display technologies. Moreover, with the continuous development of display technologies, touch structures are increasingly being integrated into the OLED display devices.

SUMMARY

In an aspect, a touch display panel is provided. The touch display panel includes: an array substrate; a pixel defining layer disposed on a side of the array substrate; a plurality of light-emitting layers correspondingly disposed in a plurality of sub-pixel regions defined by the pixel defining layer; a plurality of electrode dividing strips disposed on a side of the pixel defining layer away from the array substrate, the plurality of electrode dividing strips dividing a touch area of the touch display panel into a plurality of strip-shaped areas; and a divided electrode layer disposed on a side of the plurality of electrode dividing strips away from the array substrate and disposed in the plurality of strip-shaped areas.

The divided electrode layer includes: a plurality of first electrode strips correspondingly located in the plurality of strip-shaped areas; and a plurality of second electrode strips correspondingly located on surfaces of the plurality of electrode dividing strips away from the array substrate, the plurality of second electrode strips being insulated from the plurality of first electrode strips.

In some embodiments of the present disclosure, the touch display panel further includes: a first level signal terminal and a first touch signal terminal. At least one of the plurality of first electrode strips is connected to the first level signal terminal, and any adjacent two of the first electrode strips are configured to form a loop; each of the plurality of second electrode strips is connected to the first touch signal terminal, and any two of the plurality of second electrode strips are insulated from each other.

In some embodiments of the present disclosure, the touch display panel further includes a plurality of first level signal lines disposed at least at edge areas at both sides of the touch area. At least one of the plurality of first level signal lines is perpendicular to at least one of the plurality of first electrode strips, and both ends of each of the plurality of first electrode strips are respectively electrically connected first level signal lines to the plurality of first level signal lines at corresponding sides.

In some embodiments of the present disclosure, the touch display panel further includes: a first level signal terminal and a first touch signal terminal. Each of the plurality of first electrode strips is connected to the first level signal terminal and the first touch signal terminal, and any two of the plurality of first electrode strips are insulated from each other.

In some embodiments of the present disclosure, a shape of the touch area includes a rectangle. The plurality of first electrode strips extend along a length direction of the touch area. Or, the plurality of first electrode strips extend along a width direction of the touch area.

In some embodiments of the present disclosure, a material of at least one of the plurality of electrode dividing strips includes a positive photoresist. A shape of a cross section of the at least one of the plurality of electrode dividing strips perpendicular to a direction in which the at least one of the plurality of electrode strips extends is a trapezoid. A length of a side of the trapezoid away from the array substrate is less than a length of a side of the trapezoid proximate to the array substrate. Or, a material of at least one of the electrode plurality of dividing strips includes a negative photoresist. A shape of the cross section of the at least one of the plurality of electrode dividing strips perpendicular to a direction in which the electrode strip extends is an inverted trapezoid. A length of a side of the inverted trapezoid away from the array substrate is greater than a length of a side of the inverted trapezoid proximate to the array substrate.

In some embodiments of the present disclosure, a direction in which at least one of the plurality of electrode dividing strips extends is parallel to a column direction of the plurality of sub-pixel regions, and at least one column of the plurality of sub-pixel regions is disposed between any adjacent two electrode dividing strips in the plurality of electrode dividing strips. Or, a direction in which at least one of the plurality of electrode dividing strips extends is parallel to a row direction of the plurality of sub-pixel regions, and at least one row of the plurality of sub-pixel regions is disposed between any adjacent two electrode dividing strips in the plurality of electrode dividing strips.

In some embodiments of the present disclosure, at least one of the plurality of first electrode strips is located on a surface of a light-emitting layer away from the array substrate in a corresponding sub-pixel region in the plurality of sub-pixel regions.

In some embodiments of the present disclosure, a thickness of the electrode dividing strip in a direction perpendicular to the array substrate is 1 µm to 2 µm, and a thickness of the divided electrode layer in a direction perpendicular to the array substrate is 10 nm to 20 nm.

In some embodiments of the present disclosure, the touch display panel further includes; a thin film encapsulation (TFE) layer disposed on a side of the divided electrode layer away from the array substrate; a touch electrode layer disposed on a side of the TFE layer away from the array substrate; and a second touch signal terminal. The touch electrode layer includes a plurality of third electrode strips disposed across the plurality of first electrode strips or the plurality of second electrode strips, the plurality of third electrode strips are respectively connected to the second touch signal terminal, and any two of the plurality of third electrode strips are insulated from each other.

In some embodiments of the present disclosure, at least one of the plurality of third electrode strips is perpendicular to at least one of the plurality of first electrode strips or at least one of the plurality of second electrode strips.

In another aspect, a method of manufacturing a touch display panel is provided. The method includes:

forming an array substrate;

forming a pixel defining layer on a side of the array substrate;

forming a plurality of light-emitting layers in a plurality of sub-pixel regions defined by the pixel defining layer correspondingly;

forming a plurality of electrode dividing strips on a side of the pixel defining layer away from the array substrate, the plurality of electrode dividing strips dividing a touch area of the touch display panel into a plurality of strip-shaped areas; and depositing an electrode material on a side of the plurality of electrode dividing strips away from the array substrate and in the plurality of strip-shaped areas to form a divided electrode layer.

In a process of depositing the electrode material, the divided electrode layer is divided by the plurality of electrode dividing strips to form a plurality of first electrode strips located in the plurality of strip-shaped areas and a plurality of second electrode strips located on surfaces of the plurality of electrode dividing strips away from the array substrate, and the plurality of second electrode strips are insulated from the plurality of first electrode strips.

In some embodiments of the present disclosure, the method of manufacturing the touch display panel further includes:

forming a TFE layer on a side of the divided electrode layer away from the array substrate; and forming a touch electrode layer on a side of the TFE layer away from the array substrate, the touch electrode layer including a plurality of third electrode strips disposed across the plurality of first electrode strips or the plurality of second electrode strips, and any two of the plurality of third electrode strips being insulated from each other.

In yet another aspect, a method of driving a touch display panel is provided. The method includes: applying a first level signal to a plurality of first electrode strips in a time of a single frame, and making a plurality of second electrode strips transmit first touch signals respectively.

In yet another aspect, a method of driving a touch display panel is provided. The method includes: applying a first level signal to a plurality of first electrode strips in a display period in a time of a single frame; and making a plurality of first electrode strips transmit first touch signals respectively in a touch period in the time of the single frame.

In yet another aspect, a touch display device is provided. The touch display device includes the touch display panel as described above.

In some embodiments of the present disclosure, each of the plurality of first electrode strips is disposed in a corresponding one of the plurality of strip-shaped areas; and each of the plurality of second electrode strips is disposed on a surface of a corresponding one of the plurality of electrode dividing strips away from the array substrate.

In some embodiments of the present disclosure, the first level signal terminal includes at least one of the plurality of first level signal lines.

In yet another aspect, a method of driving another touch display panel is provided. The method includes: applying a first level signal to a plurality of first electrode strips in a time of a single frame, and making a plurality of second electrode strips transmit first touch signals respectively.

BRIEF DESCRIPTION OF THE DRAWINGS

In order to describe technical solutions in some embodiments of the present disclosure more clearly, the accompanying drawings to be used in the description of disclosure will be introduced briefly. Obviously, the accompanying drawings to be described below are merely some embodiments of the present disclosure, and a person of ordinary skill in the art can obtain other drawings according to these drawings without paying any creative effort.

DETAILED DESCRIPTION

There are mainly three touch structures that can be integrated into an OLED display device, as described below:

1) add on mode structure: touch sensing modules are attached to an OLED display panel of the OLED display device;

2) multi-layer on cell (MLOC) structure; a MLOC touch structure is directly formed on a thin film encapsulation (TFE) layer of an OLED display panel of the OLED display device; and 3) block electrode structure: a cathode layer of an OLED display panel of the OLED display device is patterned to form a plurality of block electrodes, which are reused to realize a cathode function and a touch sensing function.

The above structures 1) and 2) have disadvantages of a complex structure, a thick display panel, and a high manufacturing cost. Although the structure 3) has advantages of a simple structure, a light and thin display panel, and a low manufacturing cost, after the cathode layer is patterned to form block electrodes, a resistance at cathodes (i.e., the block electrodes) will be significantly increased. Consequently, a voltage drop at the cathodes will increase dramatically, resulting in higher power consumption of the display panel.

Based on this, the technical solutions in embodiments of the present disclosure will be described clearly and completely with reference to the accompanying drawings in the embodiments of the present disclosure. Obviously, the described embodiments are merely some but not all of the embodiments of the present disclosure. All other embodiments obtained on the basis of some embodiments of the present disclosure by a person of ordinary skill in the art without paying any creative effort shall be included in the protection scope of the present disclosure.

In some embodiments of the present disclosure, an OLED display panel is used as an application scenario. A structure of a conventional OLED display panel is briefly introduced below. It will be noted that, application scenarios on which some embodiments of the present disclosure are based are merely examples, and those skilled in the art have the ability to apply inventive concepts of some embodiments of the present disclosure to other scenarios.

Figure 1:
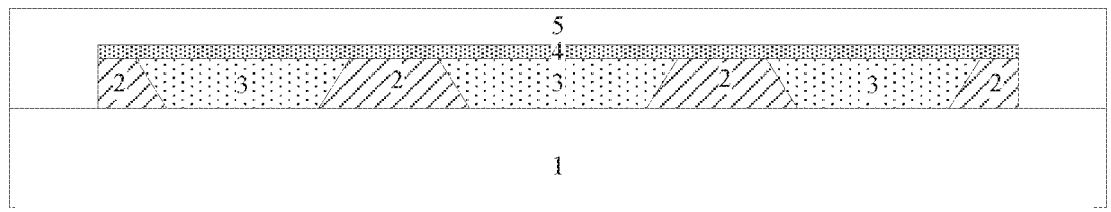
FIG. 1 is a schematic structural diagram of a conventional OLED display panel according to the related art.

As shown in FIG. 1, the conventional OLED display panel 100 mainly includes: an array substrate 1, a pixel defining layer 2, light-emitting layers 3, a cathode layer 4, and a thin film encapsulation (TFE) layer 5. The array substrate 1 includes: a base substrate, a thin film transistor (TFT) array disposed on the base substrate, and a plurality of pixel electrodes disposed on a side of the TFT array away from the base substrate. The plurality of pixel electrodes are connected to driving TFTs of sub-pixels in one-to-one correspondence. The pixel defining layer 2 is configured to define sub-pixel regions of the OLED display panel. The light-emitting layers 3 are located in the sub-pixel regions defined by the pixel defining layer 2. The cathode layer 4 covers surfaces of the pixel defining layer 2 and the light-emitting layers 3 away from the array substrate 1. A pixel electrode, a light-emitting layer 3, and the cathode layer 4 in a sub-pixel region together constitute a light-emitting device. The TFE layer 5 covers a surface of the cathode layer 4 facing away from the array substrate 1, and serves to encapsulate all light-emitting devices.

Figure 2:
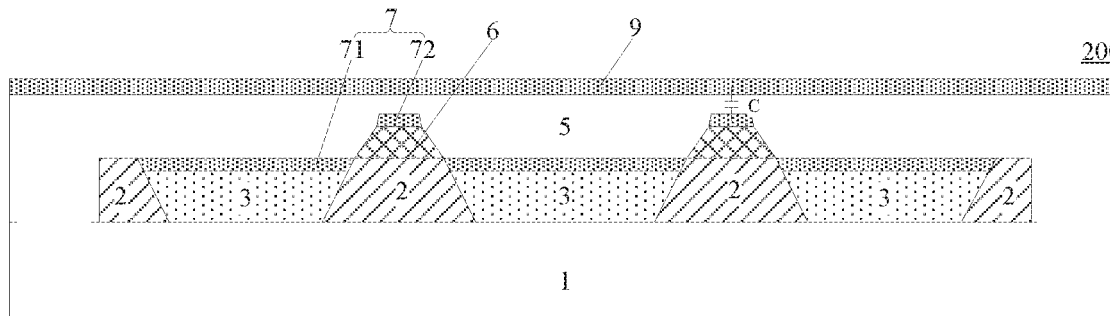
FIG. 2 is a schematic cross-sectional view of a touch display panel according to some embodiments of the present disclosure.
Figure 3:
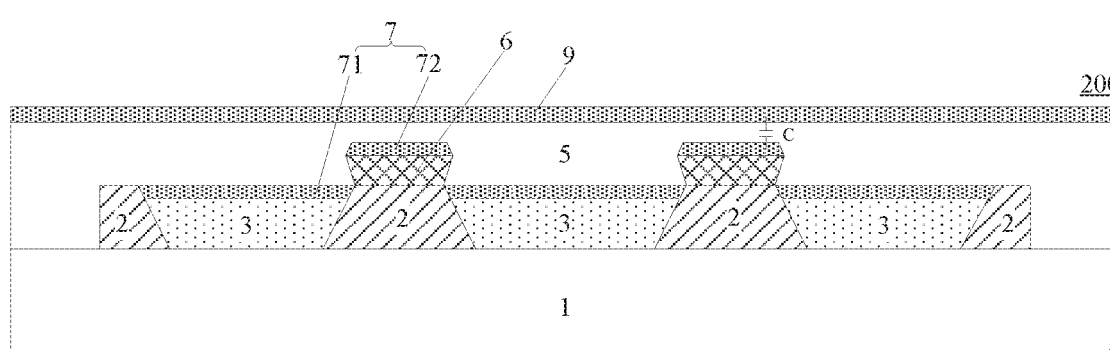
FIG. 3 is a schematic cross-sectional view of another touch display panel according to some embodiments of the present disclosure.

Referring to FIGS. 2 and 3, some embodiments of the present disclosure provide a touch display panel 200, which realizes integration of a touch structure into the touch display panel 200. The touch display panel 200 includes an array substrate 1, and a pixel defining layer 2 disposed on a side of the array substrate 1. Light-emitting layers 3 are disposed in sub-pixel regions defined by the pixel defining layer 2. The touch display panel 200 further includes: a plurality of electrode dividing strips 6 disposed on a side of the pixel defining layer 2 away from the array substrate 1, and a divided electrode layer 7 disposed on a side of the plurality of electrode dividing strips 6 away from the array substrate 1.

Referring to FIGS. 2 to 6, the plurality of electrode dividing strips 6 divide a touch area into a plurality of strip-shaped areas. The divided electrode layer 7 includes: a plurality of first electrode strips 71 located in the plurality of strip-shaped areas, and a plurality of second electrode strips 72 located on surfaces of the plurality of electrode dividing strips 6 away from the array substrate 1. The plurality of first electrode strips 71 are insulated from the plurality of second electrode strips 72.

The touch area of the touch display panel 200 is also a display area, and the touch area includes the sub-pixel regions defined by the pixel defining layer 2. Thereby, at least some of the strip-shaped areas defined by the plurality of electrode dividing strips 6 are provided with light-emitting layers 3, and surfaces of the light-emitting layers 3 away from the array substrate 1 are covered by at least some of the first electrode strips 71 of the divided electrode layer 7. That is to say, at least one of the plurality of first electrode strips 71 of the divided electrode layer 7 is located on a surface of a light-emitting layer 3 away from the base substrate 1 in a corresponding sub-pixel region, so that it may be used as an electrode of a light-emitting device that includes the light-emitting layer 3. Referring to FIGS. 2 to 6, the plurality of electrode dividing strips 6 are disposed on the side of the pixel defining layer 2 away from the array substrate 1. That is, one electrode dividing strips 6 is disposed in a gap region between two lines (i.e., two rows or two columns) of sub-pixel regions. In this way, the electrode dividing strips 6 are prevented from blocking light emitted by corresponding sub-pixel regions.

For example, the plurality of electrode dividing strips 6 are parallel or substantially parallel to each other, and any adjacent two electrode dividing strips 6 are separated by a certain region, so that there is a strip-shaped area between any adjacent two electrode dividing strips 6. The region between any adjacent two electrode dividing strips 6 is at least one line (one row or one column) of sub-pixel regions. Further, areas of regions between any adjacent two electrode dividing strips 6 are the same. In this way, the subsequently formed plurality of first electrode strips 71 and plurality of second electrode strips 72 are distributed evenly, which is conducive to improving performances of the touch display panel.

In addition, directions in which the plurality of electrode dividing strips 6 extend may be parallel to a column direction of the sub-pixel regions, or parallel to a row direction of the sub-pixel regions, which is determined according to design requirements of the subsequently formed plurality of first electrode strips 71 and plurality of second electrode strips 72. If the electrode dividing strips 6 are parallel to the column direction of the sub-pixel regions, then at least one column of sub-pixel regions is disposed between any adjacent two electrode dividing strips 6. If the electrode dividing strips 6 are parallel to the row direction of the sub-pixel regions, then at least one row of sub-pixel regions is disposed between any adjacent two electrode dividing strips 6.

In a case where a single column (or a single row) of sub-pixel regions is disposed between any adjacent two electrode dividing strips 6, each column (or each row) of sub-pixel regions correspond to a single first electrode strip 71 and a single second electrode strip 72. Thus, there will be a large number of first electrode strips 71 and second electrode strips 72, and in turn a large number of touch points. As a result, a touch accuracy of the touch display panel 200 may be improved.

In a case where multiple columns (or multiple rows) of sub-pixel regions are disposed between any adjacent two electrode dividing strips 6, the multiple columns (or multiple rows) of sub-pixel regions correspond to a single first electrode strip 71 and a single second electrode strip 72. That is, the divided electrode layer 7 is divided into a smaller number of first electrode strips 71 and second electrode strips 72, which means that the number of first electrode strips 71 is small. However, in this case, each first electrode strip 71 occupies a large area, which is conducive for reducing an electric resistance of the first electrode strip 71 in a case where the first electrode strip 71 (covering a light-emitting layer 3 in a corresponding sub-pixel region) is used as an electrode of a light-emitting device. Therefore, a voltage drop at the first electrode strip 71 being used as the electrode of the light-emitting device may be reduced.

It will be understood that, a material forming the electrode dividing strip 6 is an insulating material. In this way, it may be possible to ensure electrical insulation between the first electrode strips 71 and the second electrode strips 72 that are subsequently formed. Optionally, the material forming the electrode dividing strip 6 is a photoresist. By forming a photoresist layer on the surfaces of the pixel defining layer 2 and the light-emitting layers 3 away from the array substrate 1 through a coating process, and by exposing and developing specific areas of the photoresist layer, the required electrode dividing strips 6 may be formed.

Based on this, further, as a type of photoresist used to form the electrode dividing strips 6 differs, shapes of the formed electrode dividing strips 6 are also different. For example, the material forming the electrode dividing strip 6 is a positive photoresist. Since the positive photoresist will be changed from an insoluble photoresist to a soluble photoresist after an exposure process, regions of the photoresist layer other than regions where the electrode dividing strips are located is exposed in a process of forming the electrode dividing strips 6. Therefore, a shape of a cross section of the finally formed electrode dividing strip 6 perpendicular to the array substrate 1 and perpendicular to a direction in which the electrode dividing strip 6 extends is a trapezoid, as shown in FIG. 2. In contrast, the material forming the electrode dividing strip 6 is a negative photoresist. Since the positive photoresist will be changed from a soluble photoresist to an insoluble photoresist after the exposure process, the regions where the electrode dividing strips are located is exposed in a process of forming the electrode dividing strips 6. Therefore, the shape of the cross section of the finally formed electrode dividing strip 6 perpendicular to the array substrate 1 and perpendicular to the direction in which the electrode dividing strip 6 extends is an inverted trapezoid, as shown in FIG. 3.

It will be noted that, the term "trapezoid" means that: of two sides of the trapezoid that are parallel to the array substrate 1, a length of a side away from the array substrate 1 is less than a length of a side proximate to the array substrate 1. In contrast, the term "inverted trapezoid" means that: of two sides of the inverted trapezoid that are parallel to the array substrate 1, a length of a side away from the array substrate 1 is greater than a length of a side proximate to the array substrate 1.

It will be noted that, in a case where the shape of the cross section of the electrode dividing strip 6 is an inverted trapezoid, each side wall and a bottom surface (i.e., a side in contact with the pixel defining layer 6) of the electrode dividing strip 6 form an obtuse angle. Therefore, in a subsequent process of depositing the divided electrode layer 7 to form the first electrode strips 71 and the second electrode strips 72 at a same time, the first electrode strips 71 and the second electrode strips 72 may more easily disconnected, as compared with a case where the shape of the cross section of the electrode dividing strip 6 is a trapezoid. In other words, it may be easier to cut the divided electrode layer 7 clearly with less cutting residues.

In addition, by designing a thickness of the electrode dividing strip 6 (i.e., a size of the electrode dividing strip 6 in a direction perpendicular to the array substrate 1) and a thickness of the divided electrode layer 7 in a certain way respectively, it may also be possible to ensure that the first electrode strips 71 and the second electrode strips 72 are easily disconnected and electrode material residues between the two are reduced in the subsequent process of depositing the divided electrode layer 7 to form the first electrode strips 71 and the second electrode strips 72 at the same time. For example, the thickness of the electrode dividing strip 6 may be increased as much as possible under a premise of not significantly increasing an overall thickness of the touch display panel 200. Moreover, the thickness of the divided electrode layer 7 may be reduced as much as possible on a basis of ensuring that the first electrode strips 71 and the second electrode strips 72 have good electrical conductivity. Thus, in the process of depositing the divided electrode layer 7 on surfaces of the electrode dividing strips 6, the first electrode strips 71 and the second electrode strips 72 may be easily separated from each other.

Optionally, a thickness of the electrode dividing strip 6 is 1 μm to 2 μm, and a thickness of the divided electrode layer 7 is 10 nm to 20 nm. Since thicknesses of the electrode dividing strip 6 and the divided electrode layer 7 are not in a same order of magnitude, the divided electrode layer 7 may be more easily divided when the divided electrode layer 7 is being deposited on the electrode dividing strips 6 to form the first electrode strips 71 and the second electrode strips 72.

Referring to FIGS. 2 and 3, in some embodiments of the present disclosure, the plurality of first electrode strips 71 included in the touch display panel 200 are correspondingly located in the plurality of strip-shaped areas formed after the touch area is divided by the plurality of electrode dividing strips 6, and on surfaces of the light-emitting layers 3 away from the array substrate 1. The plurality of second electrode strips 72 included in the touch display panel 200 are correspondingly located on the surfaces of the plurality of electrode dividing strips 6 away from the array substrate 1. The first electrode strips 71 and the second electrode strips 72 are alternately arranged. Thus, in a process of depositing an electrode material on surfaces of the plurality of electrode dividing strips 6 and the light-emitting layers 3 away from the array substrate 1, a plurality of first electrode strips 71 and a plurality of second electrode strips 72 may be formed at the same time, and separated and insulated from each other.

The touch display panel 200 has both a display function and a touch function. In some embodiments of the present disclosure, referring to FIGS. 4 and 5, at least one of the plurality of first electrode strips 71 is connected to a first level signal terminal (e.g., a common voltage signal terminal VSS), and any adjacent two of the first electrode strips 71 are shorted to each other. Thus, a potential of each first electrode strip 71 is a potential supplied by the first level signal terminal. Each first electrode strip 71 may be used as an electrode of a light-emitting device in a corresponding sub-pixel region, so as to ensure that the touch display panel has the display function. Moreover, referring to FIGS. 4 and 5, each of the plurality of second electrode strips 72 is connected to a first touch signal terminal S1, and any two of the plurality of second electrode strips 72 are insulated from each other. In this way, each second electrode strip 72 may be able to transmit a first touch signal to the first touch signal terminal S1, and it may be ensured that first touch signals transmitted by different second electrode strips 72 do not interfere with each other, such that the touch display panel 200 has the touch function.

Therefore, in a case where the above structure is adopted, the touch display panel 200 provided in some embodiments of the present disclosure may be able to perform the display function and the touch function simultaneously, the two functions are independent of each other and do not interference with each other much, and the touch display panel 200 has a good display effect and a high touch sensitivity.

It will be noted that, under normal circumstances, the array substrate 1 includes pixel electrodes that correspond to respective sub-pixel regions, and the pixel electrodes are used as anodes of corresponding light-emitting devices. Each of the plurality of first electrode strips 71 covering the light-emitting layers 3 is used as a cathode of a light-emitting device including a corresponding light-emitting layer 3. In addition, since any adjacent two of the first electrode strips 71 are shorted to each other, so that the first electrode strips 71 are electrically connected to each other, even if only one or a few first electrode strips 71 are connected to the first level signal terminal (e.g., a VSS signal terminal), it may also be possible to make a potential of each first electrode strip 71 equal to a potential supplied by the first level signal terminal (e.g., a common voltage VSS). Thus, in some embodiments of the present disclosure, one or a few first electrode strips 71 are connected to the first level signal terminal (e.g., the VSS signal terminal). In this way, a connection manner of the first electrode strips 71 and the first level signal terminal may be simplified. Of course, in some other embodiments of the present disclosure, a structure in which most or even all of the first electrode strips 71 are connected to the first level signal terminal (e.g., the VSS signal terminal) is adopted. This is also allowed. In this way, a loss of potential signal (e.g., VSS signal) supplied by the first level signal terminal during a transmission process may be reduced.

It will be noted that, in some embodiments of the present disclosure, the "first touch signal" is a driving signal or a sensing signal. If the first touch signal is a driving signal, the second electrode strips 72 are used as driving lines T (e.g., T1, T2, . . . Tn in FIG. 5) in the touch structure. If the first touch signal is a sensing signal, the second electrode strips 72 are used as sensing lines R (e.g., R1, R2 . . . Rn in FIG. 4) in the touch structure.

In addition, in some embodiments of the present disclosure, the "first level signal terminal" refers to a node, a port or a wire at which corresponding first electrode strip(s) 71 is connected to a component configured to provide a first level signal (e.g., the VSS signal). Likewise, the "first touch signal terminal" refers to a node, a port or a wire at which the second electrode strips 72 is connected to a component configured to provide or read the first touch signal.

Based on this, in some embodiments of the present disclosure, referring to FIG. 4, the touch display panel 200 further includes first level signal lines (hereinafter referred to as VSS signal lines) disposed at least at edge areas at both sides of the touch area A (e.g., areas A1 and A2) in the array substrate 1. The VSS signal lines are perpendicular to the first electrode strips 71, and both ends of the first electrode strips 71 are respectively electrically connected to the VSS signal lines at corresponding sides. In this way, the first electrode strips 71 are shorted to each other and each first electrode strips 71 is electrically connected to the VSS signal terminal, so that a total number of wires required for the first electrode strips 71 to be shorted to each other in the touch display panel 200 may be reduced. Here, the first level signal terminal and the VSS signal line(s) are independent of each other; or, the first level signal terminal includes at least one of the VSS signal line(s).

Figure 4:
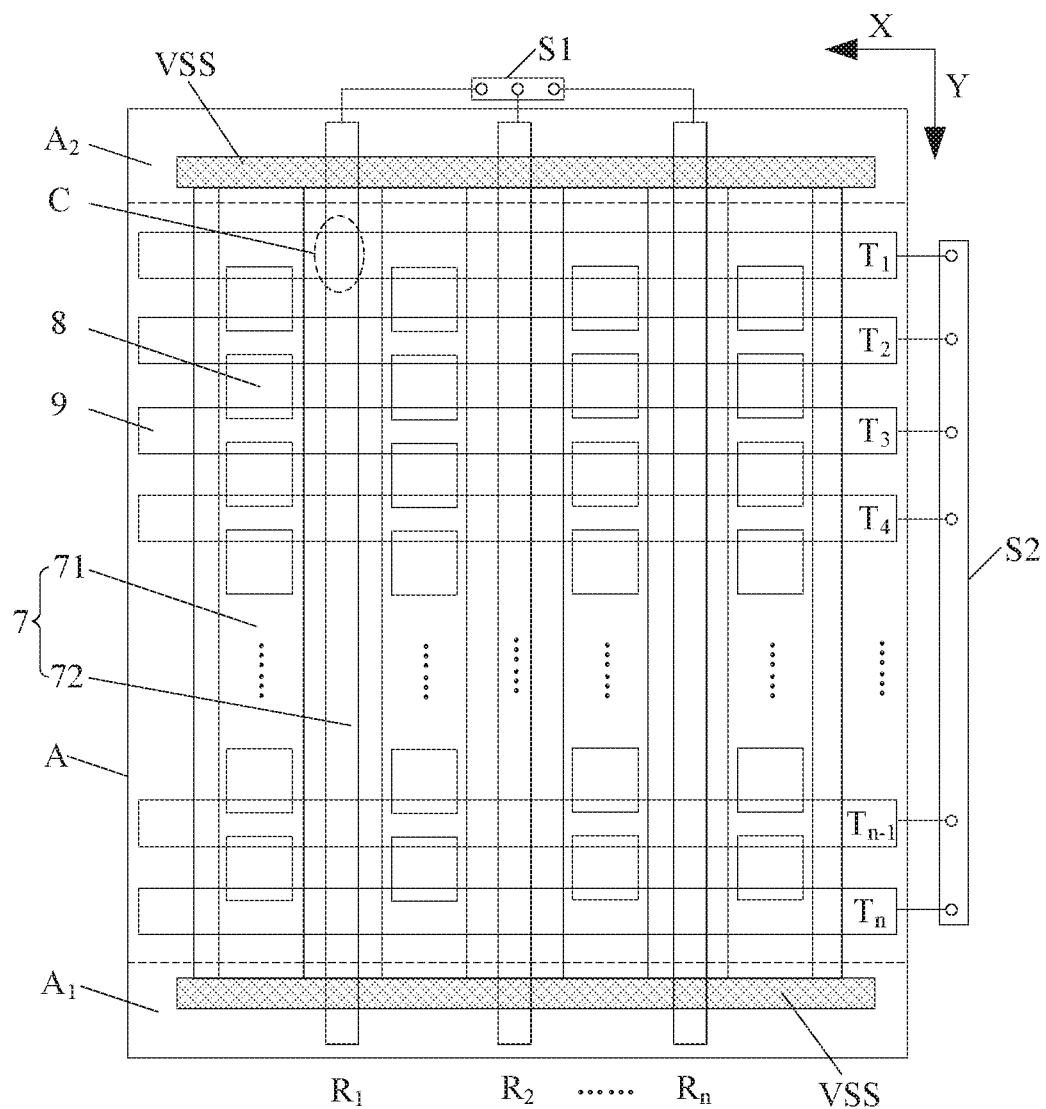
FIG. 4 is a schematic plan view of a touch display panel according to some embodiments of the present disclosure.
Figure 5:
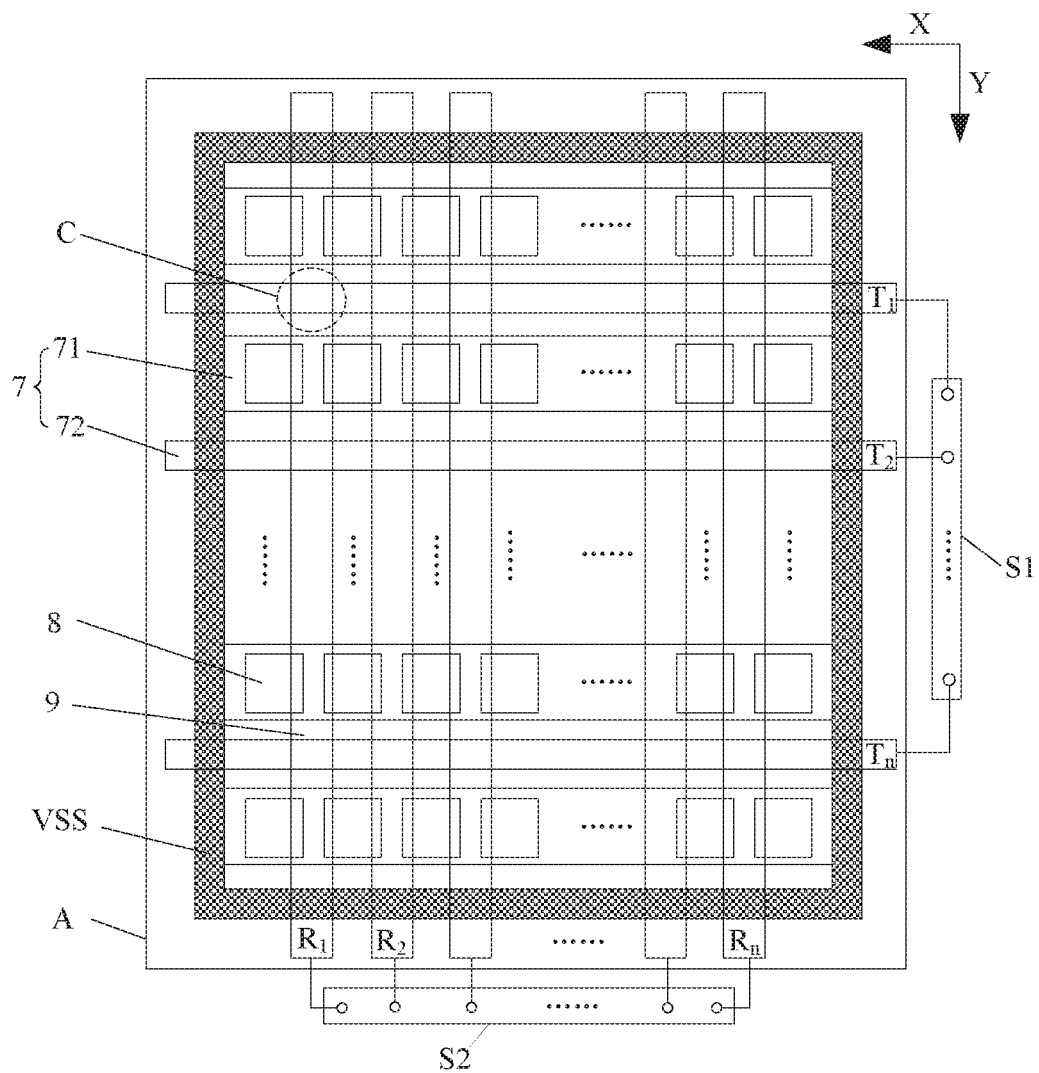
FIG. 5 is a schematic plan view of another touch display panel according to some embodiments of the present disclosure.

Further, as shown in FIG. 5, in some other embodiments of the present disclosure, a plurality of VSS signal lines are connected into a frame structure. That is, the plurality of VSS signal lines are arranged in an enclosed manner in edge areas of the touch area A in the array substrate 1. In this way, the VSS signal lines respectively disposed in areas A1 and A2 in FIG. 4 may be electrically connected to each other, and structures and wires provided for transmitting VSS signals to the VSS signal lines may be saved. Here, the first level signal terminal and the VSS signal line(s) are independent of each other; or, the first level signal terminal includes at least one of the VSS signal line(s).

It will be noted that, the VSS signal lines are disposed in the array substrate 1, for example, in a source-drain metal layer in the array substrate 1. The VSS signal lines are formed simultaneously with sources and drains of TFTs in the TFT array. Or, for example, the VSS signal lines are disposed in the pixel electrode layer in the array substrate 1. The VSS signal lines may be formed simultaneously with the pixel electrodes in the pixel electrode layer. In this way, a manufacturing process of the touch display panel 200 may be simplified. In a case where the first electrode strips 71 and the VSS signal lines are not disposed in a same layer, the first electrode strips 71 and the VSS signal lines are electrically connected through via holes. Moreover, since there are insulating film layers including at least the electrode dividing strips 6 and the pixel defining layer at a side of the second electrode strips 72 proximate to the array substrate 1, both ends of each second electrode strip 72 are separated and electrically insulated from the VSS signal lines by the insulating film layers.

In addition, the "first level signal terminal" described in some embodiments of the present disclosure is usually a low level signal terminal. Correspondingly, the aforementioned "first level signal line" is usually a low level signal line, and the "first level signal" is usually a low level signal.

Figure 6:
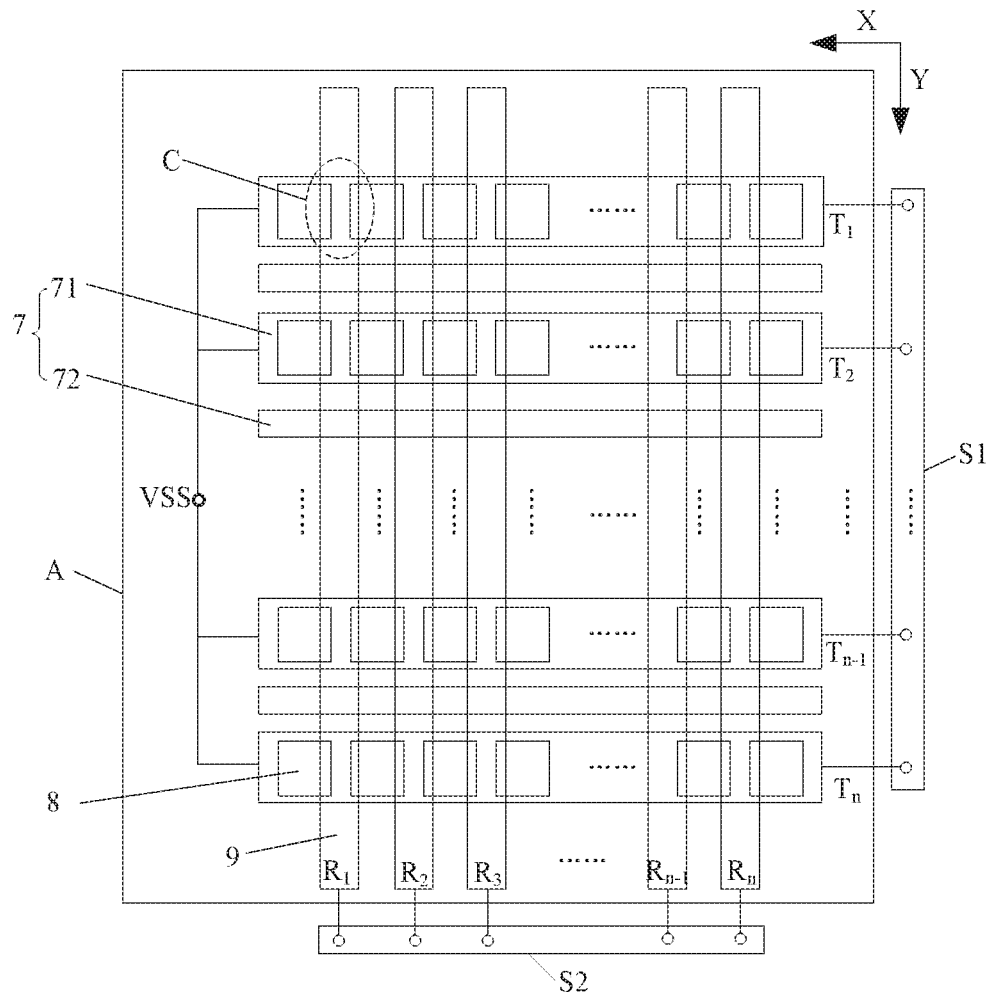
FIG. 6 is a schematic plan view of yet another touch display panel according to some embodiments of the present disclosure.

Different from the structures shown in FIGS. 4 and 5, in some embodiments of the present disclosure, referring to FIG. 6, each of the plurality of first electrode strips 71 is connected to a first level signal terminal (e.g., a VSS signal terminal) and a first touch signal terminal S1, and any two of the plurality of first electrode strips 71 are insulated from each other. The first electrode strips 71 may be reused in a time-share manner. For example, a time of a single frame is divided into a display period t1 and a touch period t2. In the display period t1, the first level signal is transmitted to each first electrode strip 71 through the first level signal terminal (e.g., the VSS signal terminal), and each first electrode strip 71 is used as an electrode of the light-emitting device in the corresponding sub-pixel region, so as to ensure that the touch display panel 200 has the display function. In the touch period t2, the first touch signal is transmitted to each first electrode strip 71 through the first touch signal terminal S1, or first touch signals are read from the first electrode strips 71 through the first touch signal terminal S1, so as to achieve transmission of the first touch signal between each first electrode strip 71 and the first touch signal terminal S1. Since the first electrode strips are insulated from each other, the first touch signals transmitted by different first electrode strips 71 do not interfere with each other. Thereby, it may be ensured that the touch display panel 200 has the touch function.

In some embodiments of the present disclosure, in a case where the structure shown in FIG. 6 is adopted, the second electrode strips 72 may be not used, and the display function and the touch function of the touch display panel 200 are realized by reusing the first electrode strips 71 in a time-share manner. Therefore, in a case where the directions in which the first electrode strips 71 and the second electrode strips 72 extend are regarded as length directions thereof, a design in which a width of the first electrode strips 71 is greater than a width of the second electrode strips 72 is adopted. The width of the first electrode strips 71 is set as wide as possible (the width is not limited by an area of the light-emitting layer 3 in the corresponding sub-pixel region). The width of the second electrode strips 72 is set as narrow as possible. In this way, an electric resistance on each first electrode strip 71 may be further reduced, which is conducive to further reducing the voltage drop on the first electrode strips 71. Moreover, in a case where the first electrode strips 71 are used as sensing lines R in the touch structure, the smaller the resistance of the first electrode strips 71, the higher the signal-to-noise ratio of sensing signals obtained by the first electrode strips 71. Therefore, it may be ensured that the touch display panel 200 has a good touch effect. In addition, in some embodiments of the present disclosure, insulating film layer(s) is disposed between the first electrode strips 71 and the first level signal terminal (e.g., the VSS signal terminal). The first electrode strips 71 are connected to the first level signal terminal (e.g., the VSS signal terminal) through corresponding via holes disposed in the insulating film layer(s). Therefore, under a premise of ensuring mutual insulation among the first electrode strips 71, the first level signal supplied by the first level signal terminal (e.g., the VSS signal terminal) are transmitted to the first electrode strips 71.

In some embodiments of the present disclosure, a shape of the touch area A of the touch display panel 200 is set to be rectangular. The first electrode strips 71 and the second electrode strips 72 extend along a length direction Y of the touch area A. That is, the first electrode strips 71 and the second electrode strips 72 are parallel to a long side of the touch area A, as shown in FIG. 4. Or, the first electrode strips 71 and second electrode strips 72 extend along a width direction X of the touch area A. That is, the first electrode strips 71 and the second electrode strips 72 are parallel to a wide side of the touch area A, as shown in FIG. 5. It will be noted that, compared with a design in which the first electrode strips 71 extend along the length direction Y of the touch area A, the design in which the first electrode strips 71 extend along the width direction X of the touch area A allows for a shorter length of the first electrodes 71. In this way, the electric resistance on each first electrode strip 71 may be further reduced, and thus the voltage drop on the first electrode strips 71 may be further reduced.

In addition, in some embodiments of the present disclosure, referring to FIGS. 2 to 6, the touch display panel 200 further includes: a TFE layer 5 disposed on a side of the divided electrode layer 7 away from the array substrate 1; and a touch electrode layer disposed on a side of the TFE layer 5 away from the array substrate 1. The touch electrode layer includes a plurality of third electrode strips 9 disposed across the plurality of first electrode strips 71 or the plurality of second electrode strips 72. The third electrode strips 9 are connected to a second touch signal terminal S2 to transmit second touch signal(s), and any two of the third electrode strips 9 are insulated from each other. Further, the plurality of third electrode strips 9 are perpendicular to the plurality of first electrode strips 71. Or, the plurality of third electrode strips 9 are perpendicular to the plurality of second electrode strips 72.

It will be noted that, in some of the above embodiments, on one hand, the TFE layer 5 can protect organic light-emitting materials of the light-emitting layers 3 from being damaged by water vapor in the external environment; on another hand, the TFE layer 5 can be used as an insulating layer between the plurality of third electrode strips 9 and both the plurality of first electrode strips 71 and the plurality of second electrode strips 72.

In a case where the first electrode strips 71 (or the second electrode strips 72) transmit the first touch signal(s), and the third electrode strips 9 transmit the second touch signal(s), since the first electrode strips 71 (or the second electrode strips 72) and the third electrode strips 9 are separated by the TFE layer 5, a mutual capacitance C is formed at each intersection of the first electrode strips 71 (or the second electrode strips 72) and the third electrode strips 9, which enables the touch display panel 200 to have the touch function.

It will be noted that, in a case where the first touch signal is a driving signal for realizing a touch function, and the second touch signal is a sensing signal generated by sensing a touch position, the first electrode strips 71 (or the second electrodes) are used as driving lines T of the touch structure, and the third electrode strips 9 are used as sensing lines R of the touch structure. Conversely, in a case where the first touch signal is a sensing signal generated by sensing the touch position, and the second touch signal is a driving signal for realizing the touch function, the first electrode strips 71 (or the second electrode strips 72) are used as sensing lines R of the touch structure, and the third electrode strips 9 are used as driving lines T of the touch structure.

In addition, it is worth mentioning that, with continued reference to FIGS. 4 to 6, each third electrode strip 9 is disposed in a gap region between two corresponding adjacent lines of pixel electrodes 8. In this way, in terms of orthographic projections of the third electrode strips 9 and the pixel electrodes 8 on the base substrate, an orthographic projection of each third electrode strip 9 at least partially overlaps with a gap region between orthographic projections of adjacent two lines of pixel electrodes 8, and there is a small overlap (of course, there may be no overlap) between edges of the orthographic projection of each third electrode strip 9 along a direction in which the third electrode strips 9 extend and orthographic projections of two lines of pixel electrodes 8 located on both sides of the third electrode strip 9. In this way, a parasitic capacitance between the third electrode strips 9 and adjacent pixel electrodes 8 may be reduced, and an influence of the third electrode strips 9 on a light transmittance of the sub-pixel regions in which the third electrode strips 9 are located may be reduced.

In the touch display panel 200 provided in some embodiments of the present disclosure, the plurality of electrode dividing strips 6 divide the divided electrode layer 7 into a plurality of first electrode strips 71 and a plurality of second electrode strips 72, such that the first electrode strips 71 are located on the surfaces of the light-emitting layers 3 away from the array substrate 1, and the second electrode strips 72 are located on surfaces of the electrode dividing strips 6 away from the array substrate 1. Thus, each first electrode strip 71 is used as an electrode (a cathode or an anode) of the light-emitting device in a corresponding sub-pixel region, and each second electrode strip 72 is used as a signal line (a driving line T or a sensing line R) in the touch structure. As a result, the touch structure may be integrated into a display panel to obtain the touch display panel 200. Or, the touch structure may be integrated into the display panel to obtain the touch display panel 200 by reusing the first electrode strips 71 in a time-share manner, that is, using each first electrode strip 71 as an electrode of the light-emitting device in the corresponding sub-pixel region during the display period t1, and as a signal line of the touch structure during the touch period t2.

Compared with the add on mode structure and the MLOC touch structure in the related art, the structure provided in some embodiments of the present disclosure is much simpler because an electrode of the light-emitting device and a signal line of the touch structure are in a same layer (e.g., the divided electrode layer 7). Moreover, the divided electrode layer 7 is located at an inner side of the TFE layer 5 (i.e., a side of the TFE layer 5 proximate to the array substrate 1). That is, in some embodiments of the present disclosure, at least a part of the touch structure is integrated inside the display panel. Therefore, the touch display panel 200 obtained by adopting such a structure is thinner and lighter.

In addition, compared to the block electrode structure in which the cathode layer of the display panel is patterned into a plurality of block electrodes in the related art, the structure provided in some embodiments of the present disclosure may be able to effectively reduce an electrical resistance on a corresponding electrode in the light-emitting device and thus reduce a voltage drop on the corresponding electrode in the light-emitting device because the strip-shaped plurality of first electrode strips 71 are used as electrodes of light-emitting devices in corresponding sub-pixel regions.

Figure 7:
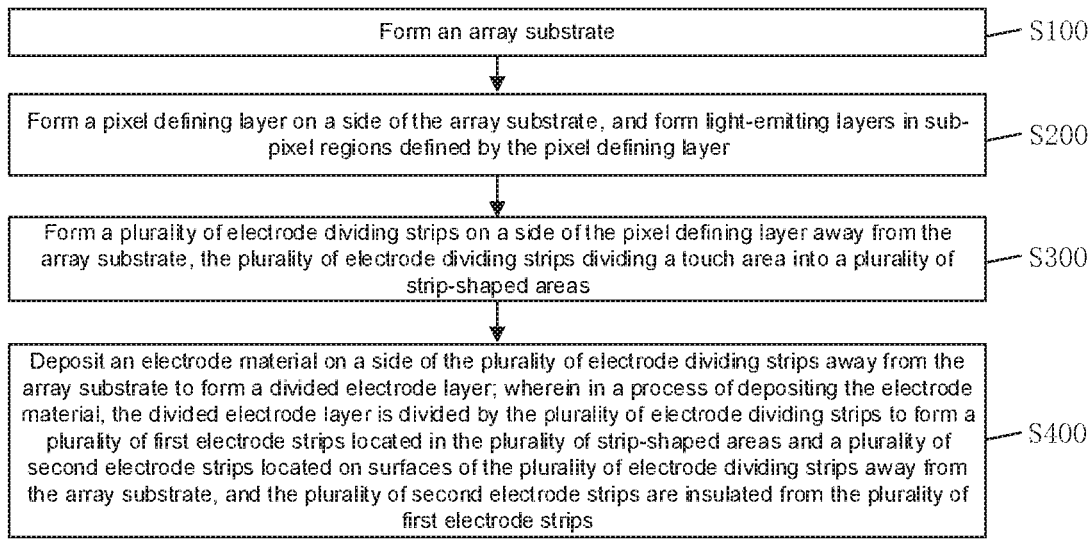
FIG. 7 is a flow chart of a method of manufacturing a touch display panel according to some embodiments of the present disclosure.

Some embodiments of the present disclosure further provide a method of manufacturing a touch display panel. Referring to FIG. 7, the method includes step 100 to step 400 (S100 to S400).

In S100, an array substrate is formed.

The above step of forming the array substrate includes: forming a TFT array on a base substrate, and forming a plurality of pixel electrodes on a side of the TFT array away from the base substrate. The pixel electrodes are respectively connected to corresponding driving TFTs in the TFT array.

In S200, a pixel defining layer is formed on a side of the array substrate, and light-emitting layers are formed in sub-pixel regions defined by the pixel defining layer.

Figure 9:
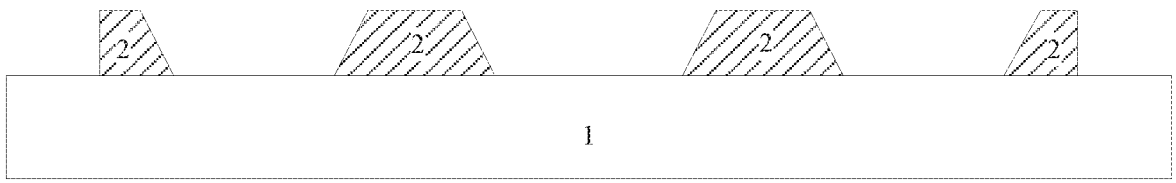
FIGS. 9 to 15 are schematic diagrams showing steps of the method of manufacturing the touch display panel shown in FIG. 8.

As shown in FIG. 9, a patterned pixel defining layer 2 is formed on a side of the formed array substrate 1. The pixel defining layer 2 has a plurality of sub-pixel patterns that look like openings, so as to define a plurality of sub-pixel regions in the touch display panel.

Figure 10:
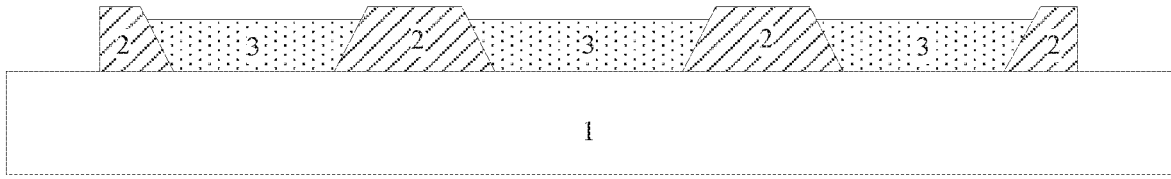

As shown in FIG. 10, light-emitting layers 3 are formed in openings of the sub-pixel regions defined by the pixel defining layer 2. Optionally, a material of the light-emitting layer 3 is an organic light-emitting material. Light-emitting layers 3 capable of emitting different colors of light are formed in different sub-pixel regions.

In S300, a plurality of electrode dividing strips are formed on a side of the pixel defining layer away from the array substrate, and the plurality of electrode dividing strips divide a touch area into a plurality of strip-shaped areas.

Figure 11:
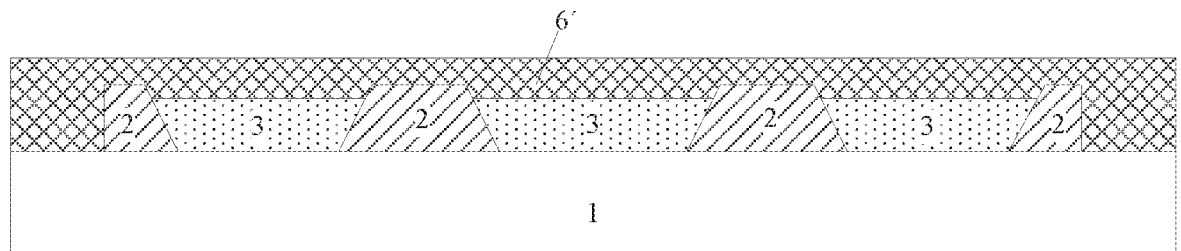
Figure 12:
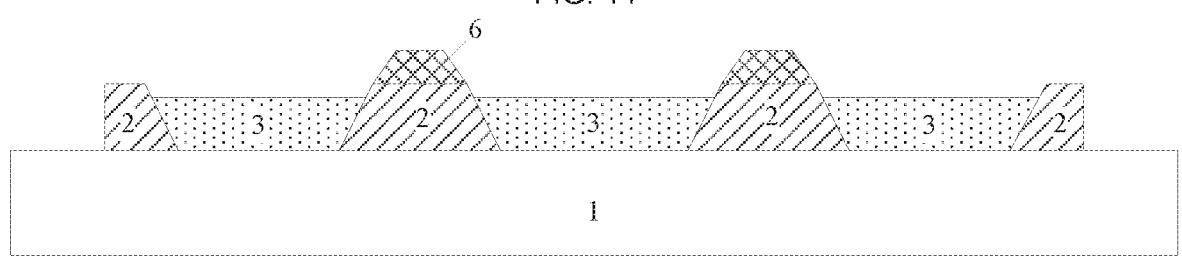

As shown in FIGS. 11 and 12, the step of forming a plurality of electrode dividing strips 6 on the side of the pixel defining layer 2 away from the array substrate 1 includes step 301 and step 302 (S301 and S302).

In S301, a photoresist layer 6' is formed by a coating process on a side of the pixel defining layer 2 away from the array substrate 1.

In S302, the photoresist layer 6' is exposed, and developed to remove photoresist materials in regions of the photoresist layer 6' other than regions where the electrode dividing strips are located. The plurality of electrode dividing strips 6 are formed by remaining photoresist materials on the pixel defining layer 2.

It will be noted that, regions that need to be exposed and developed in a case where the photoresist layer 6' is formed by a positive photoresist material are different from those in a case where the photoresist layer 6' is formed by a negative photoresist material. For example, in the case where the photoresist layer 6' is formed by a positive photoresist material, the regions that need to be exposed and developed are the regions of the photoresist layer 6' other than regions where the electrode dividing strips are located. For another example, in the case where the photoresist layer 6' is formed by a negative photoresist material, the regions that need to be exposed and developed are the regions where the electrode dividing strips are located. FIGS. 9 and 10 show an example in which the photoresist layer 6' is formed of a positive photoresist material.

In S400, an electrode material is deposited on a side of the plurality of electrode dividing strips away from the array substrate to form a divided electrode layer. In a process of depositing the electrode material, the divided electrode layer is divided by the plurality of electrode dividing strips to form a plurality of first electrode strips located in the plurality of strip-shaped areas and a plurality of second electrode strips located on surfaces of the plurality of electrode dividing strips away from the array substrate, and the plurality of second electrode strips are insulated from the plurality of first electrode strips.

Figure 13:
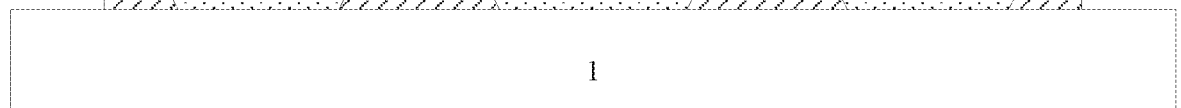

As shown in FIG. 13, in a process of depositing the electrode material on the side of the plurality of electrode dividing strips 6 away from the array substrate 1, a part of the electrode material falls on the surfaces of the light-emitting layers 3 away from the array substrate 1 to form a plurality of first electrode strips 71. Another part of the electrode material falls on the surfaces of the plurality of electrode dividing strips 6 away from the array substrate 1 to form a plurality of second electrode strips 72. Due to existence of the electrode dividing strips 6, the plurality of first electrode strips 71 may be insulated from the plurality of second electrode strips 72. That is to say, the divided electrode layer 7 is divided into a plurality of first electrode strips 71 and a plurality of second electrode strips 72 by the plurality of electrode dividing strips 6. The plurality of first electrode strips 71 are correspondingly located in the plurality of strip-shaped areas formed after the touch area is divided by the plurality of electrode dividing strips 6, and are located on the surfaces of the light-emitting layers 3 away from the array substrate 1. The plurality of second electrode strips 72 are correspondingly located on the surfaces of the plurality of electrode dividing strips 6 away from the array substrate 1.

Figure 8:
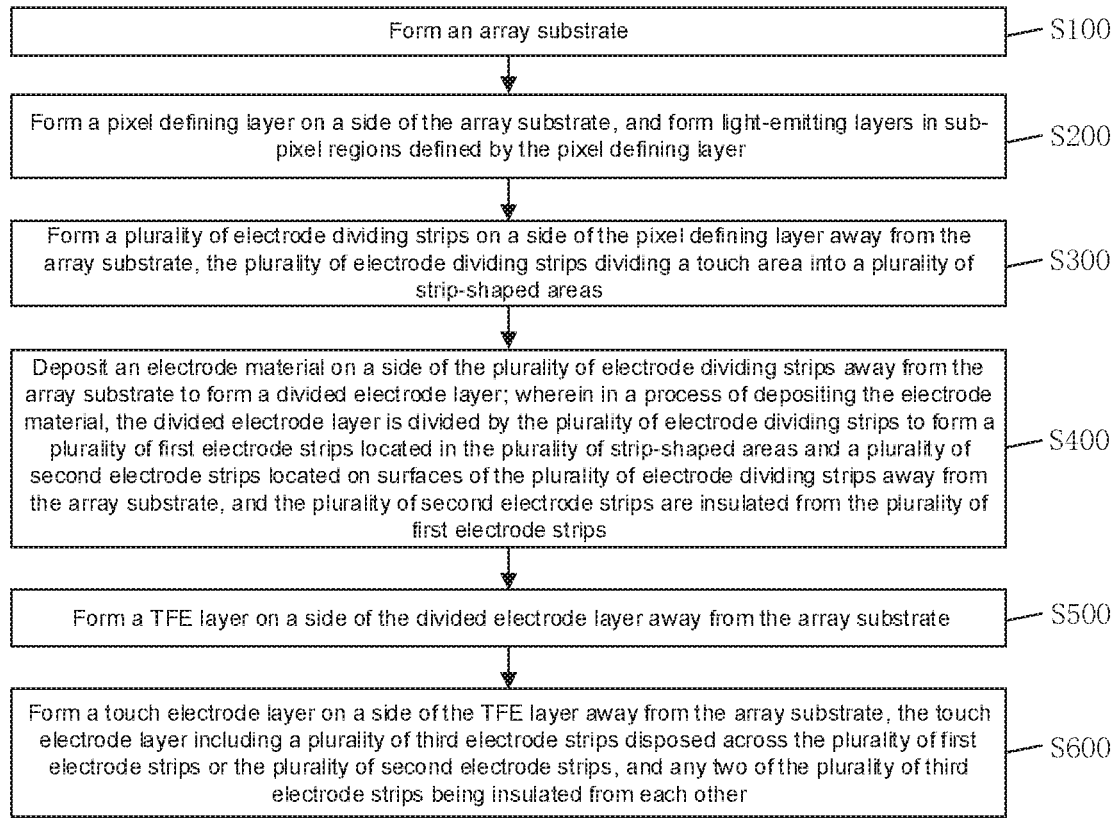
FIG. 8 is a flow chart of another method of manufacturing a touch display panel according to some embodiments of the present disclosure.

In some embodiments of the present disclosure, referring to FIG. 8, the method of manufacturing the touch display panel further includes step 500 and step 600 (S500 and S600).

In S500, a TFE layer is formed on a side of the divided electrode layer away from the array substrate.

Figure 14:
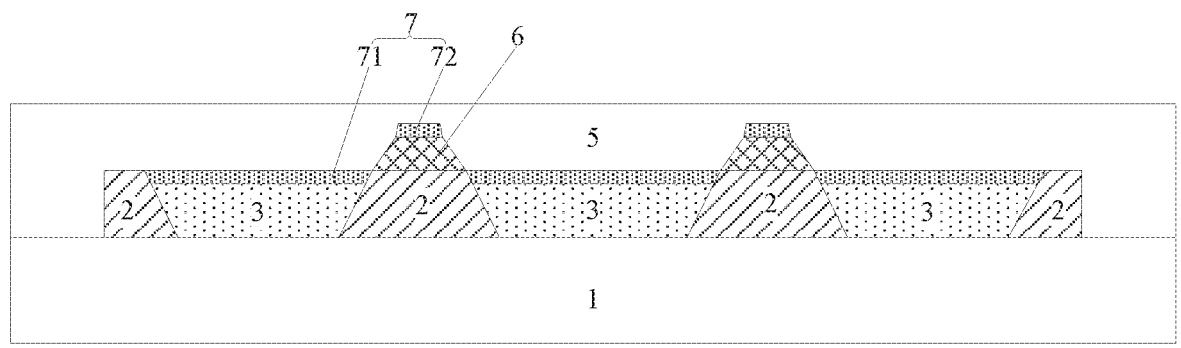

As shown in FIG. 14, the TFE layer 5 is formed on the side of the divided electrode layer 7 away from the array substrate 1. In this way, the TFE layer 5 may be used to protect the divided electrode layer 7 and light-emitting materials in the light-emitting layers 3.

In S600, a touch electrode layer is formed on a side of the TFE layer away from the array substrate. The touch electrode layer includes a plurality of third electrode strips disposed across the plurality of first electrode strips or the plurality of second electrode strips, and any two of the plurality of third electrode strips are insulated from each other.

Figure 15:
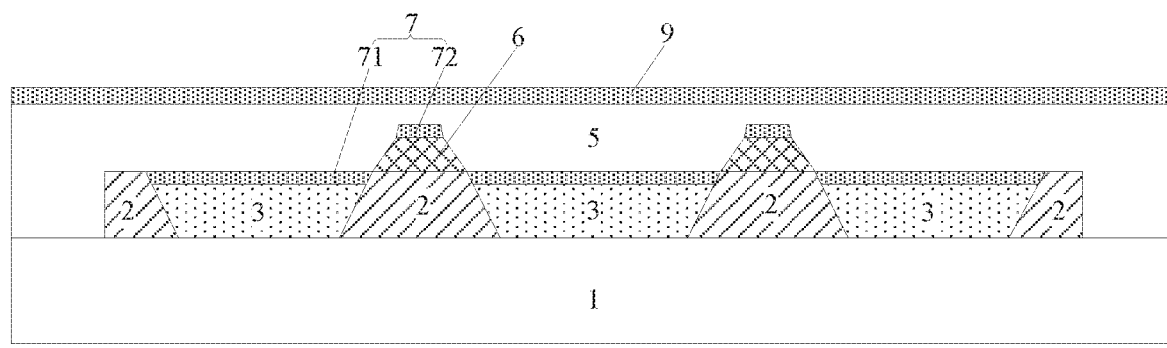

Optionally, as shown in FIG. 15, the plurality of first electrode strips 71 are disposed in parallel with the plurality of second electrode strips 72. A plurality of third electrode strips 9 are formed on a side of the TFE layer 5 away from the array substrate 1, such that directions in which the plurality of third electrode strips 9 extend are perpendicular to the directions in which the plurality of first electrode strips 71 extend, and the directions in which the plurality of third electrode strips 9 extend are perpendicular to the directions in which the plurality of second electrode strips 72 extend.

In the method provided in some of the above embodiments, the plurality of first electrode strips 71 and the plurality of second electrode strips 72 are simultaneously formed by a film layer deposition process, which greatly simplifies the manufacturing process of the touch display panel.

Some embodiments of the present disclosure further provide a method of driving a touch display panel, which is applied to a touch display panel provided in some embodiments of the present disclosure. A time of a single frame is a driving period t, and the method of driving the touch display panel includes one of the following two solutions.

Solution 1: Referring to FIGS. 4 and 5, in a touch display panel that adopts Solution 1, at least one of the plurality of first electrode strips 71 is connected to a first level signal terminal (e.g., a VSS signal terminal), and any adjacent two of the first electrode strips 71 are shorted to each other. Each of the plurality of second electrode strips 72 is connected to a first touch signal terminal S1, and any two of the plurality of second electrode strips 72 are insulated from each other. In a process of driving the touch display panel, in a time of a single frame, a first level signal (e.g., a VSS signal) is applied to the plurality of first electrode strips 71, and the plurality of second electrode strips 72 transmit first touch signal(s) respectively.

It will be noted that, in a case where the first level signal (e.g., a VSS signal) in Solution 1 is used as a signal for driving the cathode of the light-emitting device, each pixel electrode 8 in the touch display panel is used as an anode of the light-emitting device in a corresponding sub-pixel region. The cathode and the anode together drive the light-emitting layer 3 in the light-emitting device to emit light, thereby realizing the display function of the touch display panel. Moreover, in a case where the first touch signal in Solution 1 is used as a driving signal applied to the second electrode strips 72 for realizing the touch function, the second touch signal read and obtained from the third electrode strips 9 in the touch display panel is a sensing signal generated by sensing the touch position. Or, in a case where the first touch signal in Solution 1 is a sensing signal generated by sensing the touch position and is read and obtained from the second electrode strips 72, a second touch signal that need to be applied to the third electrode strips 9 in the touch display panel is a driving signal for realizing the touch function. In this way, a mutual capacitance C may be formed at each intersection of the second electrode strips 72 and the third electrode strips 9, which enables the touch display panel to have the touch function.

Solution 2: Referring to FIG. 6, in a touch display panel that adopts Solution 2, the plurality of first electrode strips 71 are connected to a first level signal terminal (e.g., a VSS signal terminal) and a first touch signal terminal S1, and any two of the plurality of first electrode strips 71 are shorted to each other. In a process of driving the touch display panel, a time of a single frame is divided into a display period t1 and a touch period t2. A first level signal (e.g., a VSS signal) is applied to the plurality of first electrode strips 71 in the display period t1. The plurality of first electrode strips 71 transmit first touch signal(s) in the touch period t2.

Figure 16:
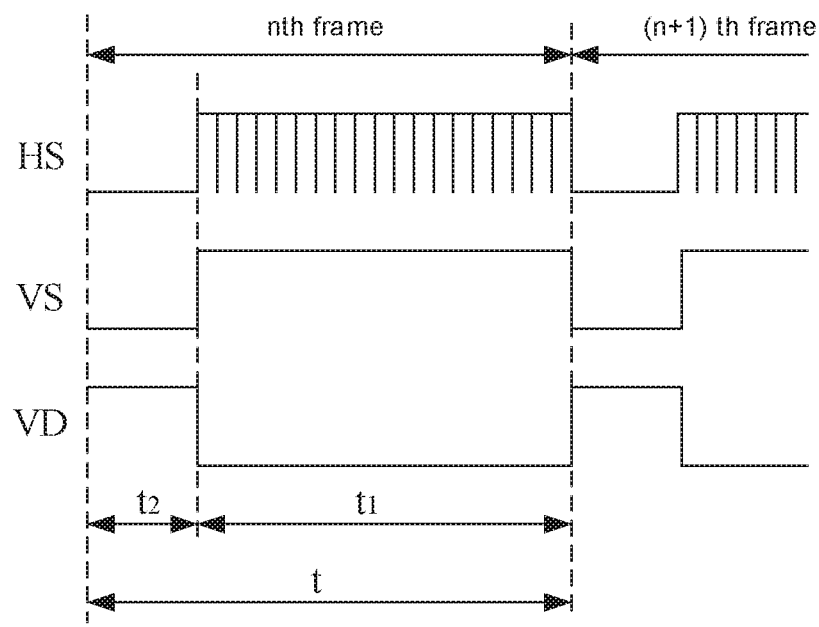
FIG. 16 is a timing control diagram of a method of driving a touch display panel according to some embodiments of the present disclosure.

Referring to FIG. 16, an example of a driving timing sequence of the Solution 2 provided in some embodiments of the present disclosure is given. In some embodiments of the present disclosure, a Vertical Driving (VD) signal is able to control the touch display panel 20 to enter the touch period t2 or the display period t1. It will be understood that, the touch period t2 is usually set in a vertical blanking period of each frame. For example, the touch period t2 is set in the vertical blanking period, and durations of the touch period t2 and the vertical blanking period are the same. A duration of the vertical blanking period in a time of each frame is equal to a length of a time interval in which a scanning signal returns from a lower right corner of a screen to an upper left corner of the screen after scanning of a current frame is completed and before scanning of a next frame begins. Since the touch period t2 is set in the vertical blanking period, normal display of the touch display panel will not be affected.

Optionally, in the touch period t2 of an nth frame, the VD signal is set high, and a Vertical Sync (VSYNC, abbreviated as VS in FIG. 16) signal and a Horizontal Sync (HSYNC, abbreviated as HS in FIG. 16) signal are both set low, so as to drive the touch display panel. In the display period t1 of the nth frame, the VD signal is set low, the VSYNC signal is set high, and the HSYNC signal includes a plurality of high level pulses that are sequentially output in a horizontal timing cycle, so as to drive the touch display panel.

It will be noted that, in a case where the first level signal (e.g., a VSS signal) in Solution 2 is used as a signal for driving the cathode of the light-emitting device, each pixel electrode 8 in the touch display panel is used as an anode of the light-emitting device in a corresponding sub-pixel region. The cathode and the anode together drive the light-emitting layer 3 in the light-emitting device to emit light, thereby realizing the display function of the touch display panel in the display period t1. Moreover, in a case where the first touch signal in Solution 2 is used as a driving signal applied to the first electrode strips 71 for realizing the touch function, the second touch signal read and obtained from the third electrode strips 9 in the touch display panel is a sensing signal generated by sensing the touch position. Or, in a case where the first touch signal in Solution 2 is a sensing signal generated by sensing the touch position and is read and obtained from the first electrode strips 72, the second touch signal that need to be applied to the third electrode strips 9 in the touch display panel is a driving signal for realizing the touch function. In this way, in the touch period t2, a mutual capacitance C may be formed at each intersection of the first electrode strips 71 and the third electrode strips 9, which enables the touch display panel to have the touch function in the touch period t2.

It is worth mentioning that, in Solution 2, the display function and the touch function of the touch display panel 200 may be realized by reusing the first electrode strips 71 in a time-share manner without using the second electrode strips 72. Therefore, in a case where the directions in which the first electrode strips 71 and the second electrode strips 72 extend are regarded as the length directions thereof, the design in which the width of the first electrode strips 71 is greater than the width of the second electrode strips 72 is adopted. The width of the first electrode strips 71 may not be limited by the area of the light-emitting layer 3 in the corresponding sub-pixel region, and the width of the first electrode strip 71 may be set as wide as possible. In this way, the electric resistance on each first electrode strip 71 may be further reduced, and a signal-to-noise ratio of sensing signals obtained through the first electrode strips 71 may be improved.

Figure 17:
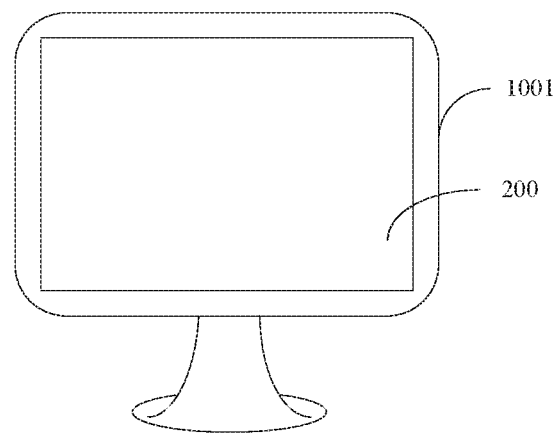
FIG. 17 is a schematic structural diagram of a touch display device according to some embodiments of the present disclosure.

Some embodiments of the present disclosure further provide a touch display device. Referring to FIG. 17, the touch display device 1001 includes a touch display panel 200 provided in some embodiments of the present disclosure. The touch display device has the advantages of a simple overall structure, light weight, and simple manufacturing process.

The touch display device provided in some embodiments of the present disclosure is any product or component having a display function, such as an OLED panel, a mobile phone, a tablet computer, a television, a monitor, a notebook computer, a digital photo frame, or a navigator.

The foregoing descriptions are merely specific implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A touch display panel, comprising:
  an array substrate;
  a pixel defining layer disposed on a side of the array substrate;
  a plurality of light-emitting layers correspondingly disposed in a plurality of sub-pixel regions defined by the pixel defining layer;
  a plurality of electrode dividing strips disposed on a side of the pixel defining layer away from the array substrate, the plurality of electrode dividing strips dividing a touch area of the touch display panel into a plurality of strip-shaped areas; and
  a divided electrode layer disposed on a side of the plurality of electrode dividing strips away from the array substrate and disposed in the plurality of strip-shaped areas; wherein
  the divided electrode layer includes:
  a plurality of first electrode strips correspondingly located in the plurality of strip-shaped areas; and
  a plurality of second electrode strips correspondingly located on surfaces of the plurality of electrode dividing strips away from the array substrate, the plurality of second electrode strips being insulated from the plurality of first electrode strips; wherein
  a material of at least one of the plurality of electrode dividing strips includes a positive photoresist, a shape of a cross section of the at least one of the plurality of electrode dividing strips perpendicular to a direction in which the at least one of the plurality of electrode dividing strips extends is a trapezoid, and a length of a side of the trapezoid away from the array substrate is less than a length of a side of the trapezoid proximate to the array substrate; or
  a material of at least one of the plurality of electrode dividing strips includes a negative photoresist, a shape of the cross section of the at least one of the plurality of electrode dividing strips perpendicular to a direction in which the at least one of the plurality of electrode dividing strips extends is an inverted trapezoid, and a length of a side of the inverted trapezoid away from the array substrate is greater than a length of a side of the inverted trapezoid proximate to the array substrate.

2. The touch display panel according to claim 1, further comprising: a first level signal terminal and a first touch signal terminal; wherein
  at least one of the plurality of first electrode strips is connected to the first level signal terminal, and any adjacent two of the first electrode strips are configured to form a loop; and
  each of the plurality of second electrode strips is connected to the first touch signal terminal, and any two of the plurality of second electrode strips are insulated from each other.

3. The touch display panel according to claim 2, comprising a plurality of first level signal lines disposed at least at edge areas at both sides of the touch area; wherein
  at least one of the plurality of first level signal lines is perpendicular to at least one of the plurality of first electrode strips, and both ends of each of the plurality of first electrode strips are respectively electrically connected to first level signal lines of the plurality of first level signal lines at corresponding sides.

4. The touch display panel according to claim 1, further comprising: a first level signal terminal and a first touch signal terminal; wherein
  each of the plurality of first electrode strips is connected to the first level signal terminal and the first touch signal terminal, and any two of the plurality of first electrode strips are insulated from each other.

5. The touch display panel according to claim 1, wherein a shape of the touch area includes a rectangle, wherein
  the plurality of first electrode strips extend along a length direction of the touch area; or,
  the plurality of first electrode strips extend along a width direction of the touch area.

6. The touch display panel according to claim 1, wherein
  a direction in which at least one of the plurality of electrode dividing strips extends is parallel to a column direction of the plurality of sub-pixel regions, and at least one column of the plurality of sub-pixel regions is disposed between any adjacent two electrode dividing strips in the plurality of electrode dividing strips; or
  a direction in which at least one of the plurality of electrode dividing strips extends is parallel to a row direction of the plurality of sub-pixel regions, and at least one row of the plurality of sub-pixel regions is disposed between any adjacent two electrode dividing strips in the plurality of electrode dividing strips.

7. The touch display panel according to claim 6, wherein at least one of the plurality of first electrode strips is located on a surface of a light-emitting layer away from the array substrate in a corresponding sub-pixel region in the plurality of sub-pixel regions.

8. The touch display panel according to claim 1, wherein
  a thickness of the electrode dividing strip in a direction perpendicular to the array substrate is 1 µm to 2 µm; and
  a thickness of the divided electrode layer in a direction perpendicular to the array substrate is 10 nm to 20 nm.

9. The touch display panel according to claim 1 comprising:
  a thin film encapsulation (TFE) layer disposed on a side of the divided electrode layer away from the array substrate;
  a touch electrode layer disposed on a side of the TFE layer away from the array substrate; and a second touch signal terminal; wherein the touch electrode layer includes a plurality of third electrode strips disposed across the plurality of first electrode strips or the plurality of second electrode strips, the plurality of third electrode strips are respectively connected to the second touch signal terminal, and any two of the plurality of third electrode strips are insulated from each other.

10. The touch display panel according to claim 9, wherein at least one of the plurality of third electrode strips is perpendicular to at least one of the plurality of first electrode strips or at least one of the plurality of second electrode strips.

11. A touch display device, comprising the touch display panel according to claim 1.

12. The touch display panel according to claim 1, wherein
each of the plurality of first electrode strips is disposed in a corresponding one of the plurality of strip-shaped areas; and
each of the plurality of second electrode strips is disposed on a surface of a corresponding one of the plurality of electrode dividing strips away from the array substrate.

13. The touch display panel according to claim 3, wherein the first level signal terminal includes at least one of the plurality of first level signal lines.

14. A method of manufacturing a touch display panel, comprising:
forming an array substrate;
forming a pixel defining layer on a side of the array substrate;
forming a plurality of light-emitting layers in a plurality of sub-pixel regions defined by the pixel defining layer correspondingly;
forming a plurality of electrode dividing strips on a side of the pixel defining layer away from the array substrate, the plurality of electrode dividing strips dividing a touch area of the touch display panel into a plurality of strip-shaped areas; and
depositing an electrode material on a side of the plurality of electrode dividing strips away from the array substrate and in the plurality of strip-shaped areas to form a divided electrode layer; wherein
in a process of depositing the electrode material, the divided electrode layer is divided by the plurality of electrode dividing strips to form a plurality of first electrode strips located in the plurality of strip-shaped areas and a plurality of second electrode strips located on surfaces of the plurality of electrode dividing strips away from the array substrate, the plurality of second electrode strips are insulated from the plurality of first electrode strips;
a material of at least one of the plurality of electrode dividing strips includes a positive photoresist, a shape of a cross section of the at least one of the plurality of electrode dividing strips perpendicular to a direction in which the at least one of the plurality of electrode dividing strips extends is a trapezoid, and a length of a side of the trapezoid away from the array substrate is less than a length of a side of the trapezoid proximate to the array substrate; or
a material of at least one of the plurality of electrode dividing strips includes a negative photoresist, a shape of the cross section of the at least one of the plurality of electrode dividing strips perpendicular to a direction in which the at least one of the plurality of electrode dividing strips extends is an inverted trapezoid, and a length of a side of the inverted trapezoid away from the array substrate is greater than a length of a side of the inverted trapezoid proximate to the array substrate.

15. The method of manufacturing the touch display panel according to claim 14, further comprising:
forming a TFE layer on a side of the divided electrode layer away from the array substrate; and
forming a touch electrode layer on a side of the TFE layer away from the array substrate, the touch electrode layer including a plurality of third electrode strips disposed across the plurality of first electrode strips or the plurality of second electrode strips, and any two of the plurality of third electrode strips being insulated from each other.

* * * * *